US005959471A

United States Patent [19]
Weinfurtner

[11] Patent Number: 5,959,471
[45] Date of Patent: Sep. 28, 1999

[54] METHOD AND APPARATUS FOR REDUCING THE BIAS CURRENT IN A REFERENCE VOLTAGE CIRCUIT

[75] Inventor: Oliver Weinfurtner, Fishkill, N.Y.

[73] Assignee: Siemens Aktiengesellschaft, Munich, Germany

[21] Appl. No.: 08/937,571

[22] Filed: Sep. 25, 1997

[51] Int. Cl.[6] .......... H03K 5/153

[52] U.S. Cl. .......... 327/94; 327/124

[58] Field of Search .......... 327/109, 124, 327/157, 536, 537, 544, 94

[56] References Cited

U.S. PATENT DOCUMENTS 5,473,273 12/1995 Warner et al. .......... 327/94
5,692,025 11/1997 Sato et al. .......... 377/58
5,699,063 12/1997 Takayma .......... 341/118
5,793,231 8/1998 Whittaker .......... 327/95

*Primary Examiner*—Kenneth B. Wells
*Assistant Examiner*—Maria Hasanzadah
*Attorney, Agent, or Firm*—Stanton C. Braden

[57] ABSTRACT

A method for reducing the current consumption of a reference voltage circuit while a synchronous DRAM is in standby power-down mode is provided. The reference voltage is stored on a capacitor within the DRAM circuit. The reference voltage circuit is selectively disconnected from, and reconnected to the Vref-node at predetermined time intervals during a power down mode, in order to ensure leakage compensation. When the power down mode exceeds a predetermined time, the reference voltage circuit is disabled to further reduce the current consumption.

14 Claims, 2 Drawing Sheets

METHOD AND APPARATUS FOR REDUCING THE BIAS CURRENT IN A REFERENCE VOLTAGE CIRCUIT

BACKGROUND OF THE INVENTION

FIELD OF THE INVENTION

The present invention relates to a circuit for reducing the bias current in a reference voltage circuit. More specifically, it relates to a method and circuit for reducing current consumption of a reference voltage supply to a semiconductor memory.

BACKGROUND OF THE INVENTION

Numerous reference voltages are provided for powering a semiconductor memory. The voltages are derived from a few (or even just one) reference voltage circuits, e.g., a bandgap reference circuit supplies a reference voltage to a synchronous DRAM.

This bandgap reference voltage circuit consumes a constant current of typically 7–10 $\mu$A from a power supply. This current consumption is acceptable during normal operation of the chip, when the overall current consumption of the chip is in the range of several hundred milli-amps. However, in power down mode, the maximum current consumption of the chip is in the order of magnitude of 100 $\mu$A. In this case, the power consumption of the reference circuit contributes significantly to the overall power consumption.

One method to reduce power consumption during a standby mode was proposed by U.S. Pat. No. 5,189,316, which is entitled Stepdown Voltage Generator Having an Active Mode And a Standby Mode. According to that disclosure, an integrated circuit includes a stepdown circuit for stepping down a supply voltage supplied by an external power supply, an inactivating means for disabling (inactivating) the stepdown circuit during the standby mode, and a supply voltage applying means for directly applying the supply voltage from an external power supply to the main circuit during standby mode.

SUMMARY OF THE INVENTION

According to an illustrative embodiment of the invention, a stabilized reference voltage (Vref) is stored on a capacitor within an integrated circuit, such as a synchronous DRAM chip, and a reference voltage circuit generating the Vref is disconnected from the Vref-node upon detection of a power down condition of the chip. The detection of the power down condition starts a counter. When the power down condition exists for a first predetermined time period, the reference voltage circuit is further disconnected from an external power supply feeding the same. After a second predetermined time period in the power down mode, the external power supply is reconnected to the reference voltage circuit. The Vref-node is then reconnected to the reference voltage circuit when either a third predetermined time period in the power down mode is detected, or the power down mode is terminated.

If the power down mode is terminated prior to reaching the first predetermined time period, the reference voltage circuit is reconnected to the Vref-node.

An illustrative embodiment of the invention includes an oscillator for generating a clock signal which is supplied to the counter. The counter outputs counter signals (i.e., time marks) to a controller which controls the operation of the circuit. A first switching means is disposed between the reference voltage circuit output and a Vref-node within the circuit and selectively disconnects Vref-node from the reference voltage circuit. A second switching means disposed between the reference voltage power supply input and an external power supply selectively disconnects the power supply feeding the reference voltage circuit. The first and second switching circuits are connected to, and controlled by, the controller.

The reference voltage Vref is preferably momentarily stored in a capacitor within the chip circuit. The capacitor may be one of the decoupling capacitors in the circuit. The momentarily stored Vref enables a cyclic connection and disconnection of the reference voltage circuit via the first switching means without interrupting the operation of the circuit.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

The invention generally relates to power conservation and particular to power conservation in electronic circuits. To facilitate discussion, the invention is described in the context of semiconductor memory circuits. However, the invention is broader and is applicable to electronic circuits using reference voltage circuits.

Figure 1:
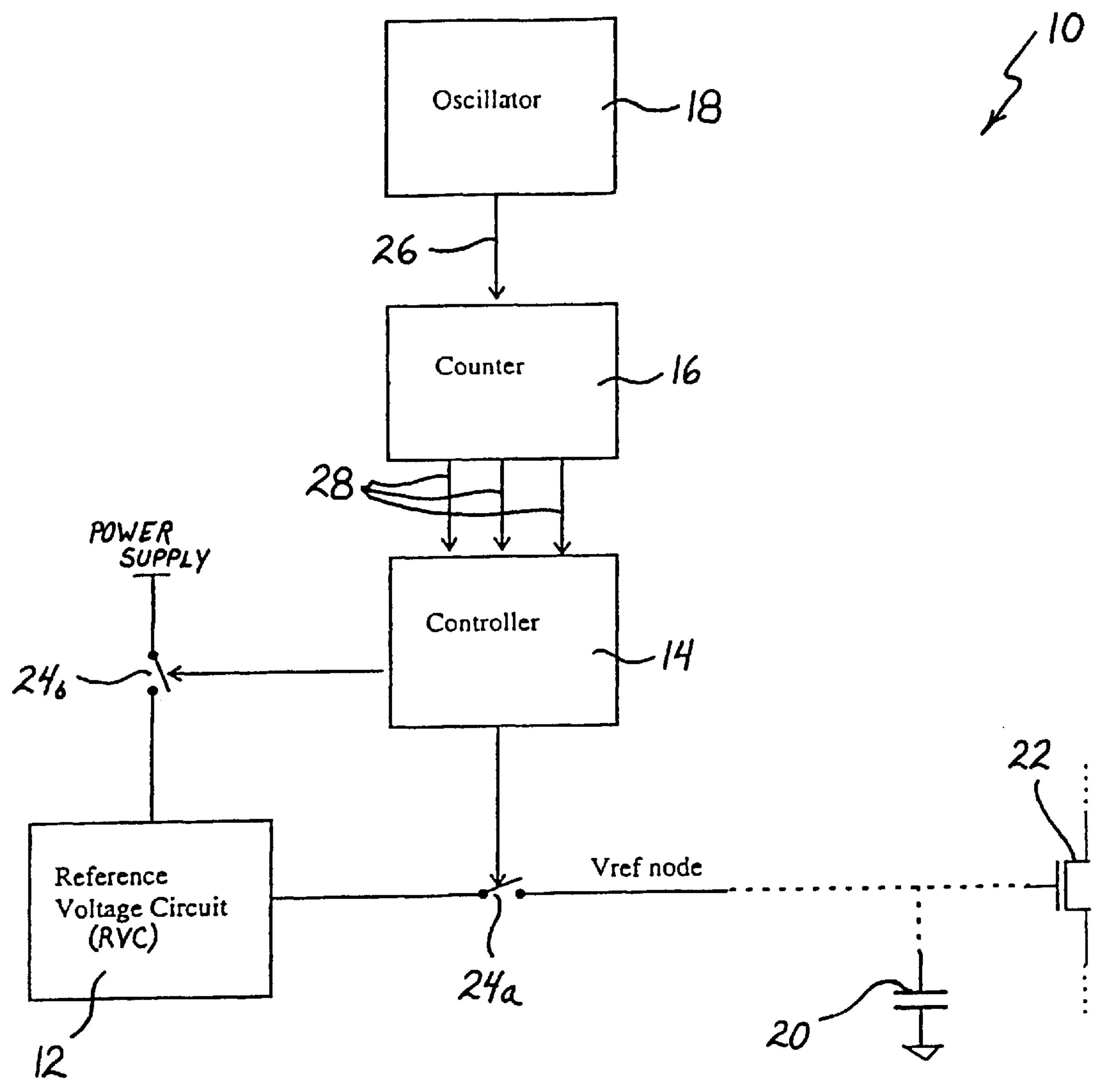
FIG. 1 is a block diagram of a bias current reduction circuit according to the invention.

Referring to FIG. 1, the control circuit 10 includes a switch 24*a* which selectively connects reference voltage circuit 12 to the Vref-node. A switch 24*b* selectively connects reference voltage circuit 12 to an external power supply (not shown), and thereby enables a controller 14 to selectively activate or deactivate reference voltage circuit 12. Controller 14 is a state machine adapted to control the switching connections between the reference voltages circuit 12 and its external power supply, and its connection to Vref-node. It is apparent to one skilled in the art that the state machine (controller 14) can be implemented with simple logic circuitry such as, for example, logic gates, flip flops or even more complex processor control circuitry.

Switch 24*b* is shown as a symbolic representation of one method by which reference voltage circuit 12 can be disabled by disconnecting it from its external power supply. Other electronically intelligent methods for disabling reference voltage circuit 12 can also be employed without departing from the scope of this disclosure.

Controller 14 receives counter signals 28 from counter 16, which is driven by a clock signal 26 generated by oscillator 18. Oscillator 18 can be an existing oscillator used for other chip functions that cannot be turned off during power down mode, or a dedicated oscillator designed for this purpose.

When switch 24*a* is closed, reference voltage circuit 12 is connected to, for example, decoupling capacitances 20 and to the gates of transistors 22 throughout the chip, which form an additional parasitic capacitance. The capacitance added can be a completely parasitic one or a combined decoupling parasitic capacitance. There are no ohmic loads driven by reference voltage circuit 12.

Upon power-up of the chip, capacitances 20 will be charged to Vref. The reference voltage Vref will remain stable on this capacitance even if the reference voltage circuit 12 is separated from the Vref-node by a switch. The capacitances 20 effectively sample the Vref voltage and store the same. Since Vref is only connected to the gates of transistors 22, the leakage from Vref node is extremely small, and the time that switches 24*a* and 24*b* can be opened is in the millisecond range or higher.

In a power down mode, controller 14 opens switch 24*a* to separate Vref-node from reference voltage circuit 12. After a predetermined time has elapsed in the power down mode, controller 14 disconnects reference voltage circuit 12 from its external power supply (via switch 24*b*) to deactivate reference voltage circuit 12. The opening of switch 24*a* prevents current flow from the Vref-node into reference voltage circuit 12, and the disconnection of circuit 12 from its external power supply causes the power consumption of reference voltage circuit 12 to be zero.

In order to ensure that leakage currents are compensated on the Vref-node, the reference voltage circuit 12 is selectively turned on (i.e, reconnected to the external power supply) at regular intervals (e.g., for 40 μs every 2 ms). After the output voltage of the reference voltage circuit 12 is stable, switch 24*a* is closed to reconnect Vref-node with reference voltage circuit 12. Thus, a drop in Vref due to the leakage currents is compensated. The timing of the cycle is dependent on the amount of leakage to be compensated. For example, if the leakage current are low, the timing required for compensation will be less than when the leakage currents are high. The minimum on/off ratio of switch 24*a* is a function of process characteristics, and can be adjusted according to the actual leakage current on the Vref-node.

Figure 2:
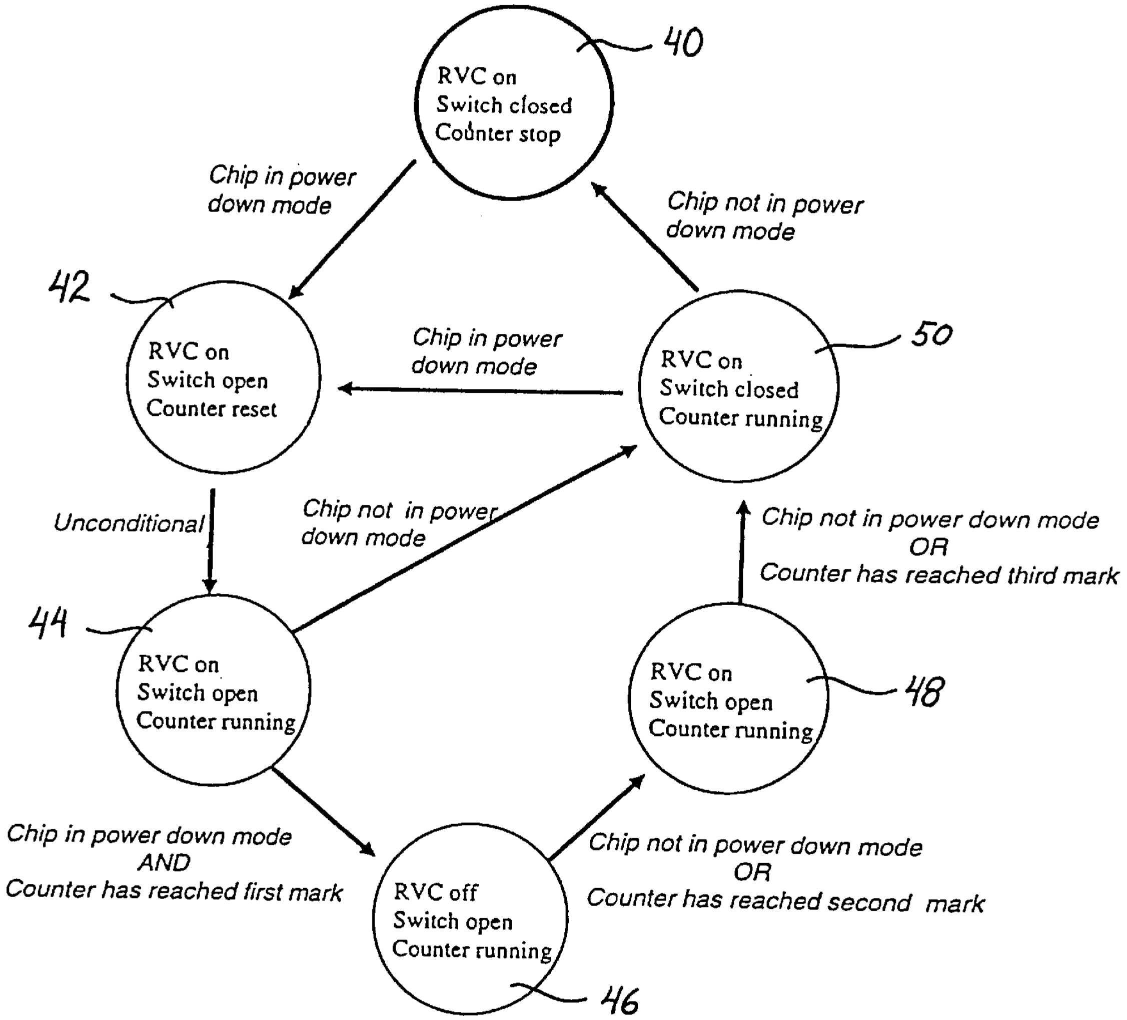
FIG. 2 is a state diagram of a state machine (controller) for controlling the power conservation during the power down mode of a DRAM.

FIG. 2 shows a state diagram of the operation of controller 14 during the power-up or power down mode of the chip. During operation or power-up, reference voltage circuit (RVC) 12 is on (i.e., connected to its external power supply via switch 24*b*), and switch 24*a* is closed when the output of RVC 12 is stabilized to connect RVC 12 with the Vref node. When the power down mode is been detected (state 42 of the control), RVC 12 is on, switch 24*a* is open to disconnect Vref-node from RVC 12, and counter 16 is reset. Subsequent to the resetting of counter 16, and the disconnection of Vref node from RVC 12, counter 16 begins running while RVC 12 remains on at state 44. If the chip remains in power-down mode, as a result of inactivity, counter 16 will reach a first predetermined timing mark, and RVC 12 will be switched off by opening switch 24*b* at state 46. If, after reaching the first counter mark and proceeding to state 46, the chip is not in power-down mode, or counter 16 reaches a second timing mark, controller 14 proceeds to state 48 where switch 24*b* is closed and RVC 12 is reactivated. If the power down mode is halted for some reason before counter 16 reaches its first timing mark (e.g., chip function is in demand), controller 14 proceeds to state 50 to reconnect Vref-node with RVC 12 by closing switch 24*a*.

When the chip is no longer in power-down mode, or counter 16 reaches a third timing mark, controller 14 proceeds to state 50 where switch 24*a* is closed to reconnect Vref-node to RVC 12. At state 50, the counter is still running. When the chip is in power down mode, controller 14 proceeds to state 42, opens switch 24*a* and resets counter 16 to start the process again. When the chip is not in a power down mode, controller 14 proceeds to state 40 where switch 24*a* is closed, and the counter is stopped.

The predetermined timing marks that implement states 46, 48, and 50, are variable according to the amount of leakage that needs to be compensated in the respective circuit. In an illustrative example of the invention, the RVC 12 is turned on for 40 μs every 2 ms. Thus, when power down mode is detected, RVC 12 is already on, and therefore the first predetermined timing mark is set at approximately 40 μs from the starting of the counter (state 42). Referring to FIG. 2, the deactivation of RVC 12 in state 46 would occur approximately 40 μs after resetting of the counter at state 42, provided the chip remains in power down mode. The second and third timing marks are not as critical as the first, and are set according to the on/off timing ratio needed to actuate the connection and disconnection of Vref-node from the output of RVC 12, via switch 24*a*, and re-connect RVC 12 to its external power supply. Thus, the initial 40 μs for states 42 and 44 will probably be slightly lower to compensate for the additional time needed for the on/off switching ratio at states 48 and 50 when RVC 12 is also active or on.

For example, the entire process of cycling through states 42, 44, 46, 48 and 50 in power down mode should take only 2 ms. The bulk of this time (i.e. 1.96 ms) is spent at state 46 where RVC 12 is off. The remaining time for states 42, 44 and 48, 50 are the states when RVC 12 is on, and therefore will only be active for a total of 0.04 ms or 40 μs.

Although disclosed as a power saving technique during power down mode of a semiconductor memory, it is also contemplated to incorporate this technique during normal operation. Since the power consumption of the semiconductor chip during normal operation is much higher than power down mode, the recognized power savings will be substantially less. The normal operation of the semiconductor chip will not be interrupted by the presented technique.

Therefore, it should be understood that the present invention is not limited to the particular embodiment disclosed herein as the best mode contemplated for carrying out the present invention, but rather that the present invention is not limited to the specific embodiments described in this specification except as defined in the appended claims.

I claim:

1. A method for reducing power consumption in a reference voltage circuit comprising the steps of:

storing a reference voltage (Vref) on at least one capacitor in a circuit being supplied by the reference voltage circuit;

detecting a power down mode of the supplied circuit;

disconnecting the reference voltage circuit from a Vref-node within the supplied circuit when the power down mode is detected;

measuring the time of the power down mode; and deactivating the reference voltage circuit after a first predetermined time period in the power down mode.

2. The method according to claim 1, further comprising the steps of:

reactivating the reference voltage circuit after a second predetermined time period in the power down mode; and re-connecting the reference voltage circuit with the Vref-node.

3. The method according to claim 1, further comprising the steps of:

re-connecting the reference voltage circuit with the Vref-node within the circuit when the power down mode has been terminated before a first predetermined time period; and stopping the measurement of time of the power down mode.

4. The method according to claim 1, wherein said step of disabling the reference voltage circuit from the Vref-node is performed by opening a switch connecting the reference voltage circuit and the Vref-node.

5. The method according to claim 1, wherein said step of deactivating the reference voltage circuit further comprises the step of disconnecting the reference voltage circuit from an external power supply providing power to the reference voltage circuit.

6. The method according to claim 2, wherein said step of re-connecting the reference voltage circuit with the Vref-node is performed after a third predetermined time period in the power down mode.

7. The method according to claim 2, wherein said step of reconnecting the reference voltage circuit with the Vref-node is performed when the power down mode has been terminated.

8. An apparatus for reducing bias current in a reference voltage circuit, the reference voltage circuit generating a reference voltage (Vref) and receiving power from a power supply, the apparatus comprising:

a counter having a clock signal output;

a control circuit coupled to a supplied circuit for detecting a power down mode, said control circuit having at least one input coupled to said clock signal output and a plurality of control outputs for outputting control signals; and first and second switches connected to said plurality of control outputs and the reference voltage circuit for connecting and disconnecting the reference voltage circuit with the power supply and a Vref-node, respectively, in response to said control signals upon detection of said power down mode.

9. The apparatus according to claim 8, further comprising at least one capacitor connected to the Vref-node and adapted to store the reference voltage Vref.

10. The apparatus according to claim 8, further comprising an oscillator connected to said counter for generating the clock signal.

11. The apparatus according to claim 8, wherein said control circuit controls said second switch to disconnect the reference voltage circuit from the Vref-node when a power down condition of the circuit is detected.

12. The apparatus according to claim 8, wherein said control circuit controls said first switch to disconnect the reference voltage circuit from the power supply when a power down condition of the circuit exists for a predetermined time.

13. The apparatus according to claim 8, wherein said first and second switches further comprises:

first switch means coupled to one of said plurality of control outputs and connecting the reference voltage circuit with a Vref-node within a circuit;

second switch coupled to one of said plurality of control outputs and connecting the reference voltage circuit with the power supply.

14. An apparatus for reducing bias current in a reference voltage circuit, the reference voltage circuit generating a reference voltage Vref and receiving power from a power supply, the apparatus comprising:

an oscillator for generating clock signals;

a counter connected to said oscillation means and having a clock signal output;

a controller for detecting a power down mode and having at least one input coupled to said clock signal output and a plurality of control outputs for outputting control signals;

a first switch connected between the reference voltage circuit and a Vref-node and coupled to one of said plurality of control outputs for selectively disconnecting the reference voltage circuit from a Vref-node in response to a received control signal;

a second switch connected between the reference voltage circuit and the power supply and coupled to one of said plurality of control outputs for selectively disconnecting the reference voltage circuit from the power supply in response to a received control signal; and at least one capacitor connected to the Vref-node and adapted to store the reference voltage Vref.

* * * * *